(12) United States Patent
Chiba et al.

(10) Patent No.: US 9,427,921 B2
(45) Date of Patent: Aug. 30, 2016

(54) POLYDIMETHYLSILOXANE SHEET, OPTICAL ELEMENT INCORPORATING THE SAME, AND MANUFACTURING METHOD THEREOF

(75) Inventors: Tsuyoshi Chiba, Tokyo (JP); Hiroshi Fujita, Tokyo (JP); Yuki Aritsuka, Tokyo (JP)

(73) Assignee: DAI NIPPON PRINTING CO., LTD., Tokyo (JP)

(*) Notice: Subject to any disclaimer, the term of this patent is extended or adjusted under 35 U.S.C. 154(b) by 1191 days.

(21) Appl. No.: 13/405,940

(22) Filed: Feb. 27, 2012

(65) Prior Publication Data

US 2012/0224264 A1 Sep. 6, 2012

(30) Foreign Application Priority Data

Mar. 3, 2011 (JP) ................. 2011-046011

(51) Int. Cl.
| | |
|---|---|
| G02B 5/18 | (2006.01) |
| B29D 11/00 | (2006.01) |
| C09D 183/06 | (2006.01) |
| B32B 5/14 | (2006.01) |
| B32B 27/28 | (2006.01) |
| H05K 1/03 | (2006.01) |
| B82Y 20/00 | (2011.01) |
| G02B 5/30 | (2006.01) |

(52) U.S. Cl.
CPC ......... *B29D 11/00346* (2013.01); *B32B 5/145* (2013.01); *B32B 27/283* (2013.01); *B82Y 20/00* (2013.01); *C09D 183/06* (2013.01); *G02B 5/3066* (2013.01); *H05K 1/036* (2013.01); *Y10T 428/24355* (2015.01); *Y10T 428/24967* (2015.01); *Y10T 428/31663* (2015.04)

(58) Field of Classification Search
CPC ... B82Y 20/00; G02B 5/3066; G02F 1/0136; B29D 11/00326; B29D 11/00346; Y10T 428/24355; Y10T 428/24967; Y10T 428/31663; C09D 183/04; C09D 183/06; C09D 183/14; H05K 1/036; H05K 1/0393; B32B 2383/00; B32B 5/14; B32B 5/145; B32B 7/00; B32B 27/00; B32B 27/06; B32B 27/08; B32B 27/283; C08L 83/04; C08L 83/06

See application file for complete search history.

(56) References Cited

U.S. PATENT DOCUMENTS

| 4,039,505 A | * | 8/1977 | Homan et al. ................ 524/865 |
| 2011/0012478 A1 | * | 1/2011 | Najafi et al. .................. 310/334 |

(Continued)

FOREIGN PATENT DOCUMENTS

WO   WO 2010032728 A1 * 3/2010

*Primary Examiner* — Nancy Johnson
(74) *Attorney, Agent, or Firm* — Oliff PLC

(57) ABSTRACT

A PDMS sheet that ensures good adhesion, handleability and stability to metal thin films or metal patterns of any desired shape, an optical element that is kept against de-bonding or exfoliation of metal patterns and has high reliability as well as good handleability and stability, and manufacturing methods thereof. The inventive optical element comprises a polydimethyl-siloxane sheet having a pattern-formation surface defined by one surface and a base surface defined by another surface, and a plurality of metal patterns positioned on the pattern-formation surface. Given a low-molecular-weight siloxane of a cyclic structure represented by $[-Si(CH_3)_2O-]_k$ where k is an integer of 3 to 20 inclusive, polydimethylsiloxane sheet comprises a structure where the content of the low-molecular-weight siloxane at the pattern-formation surface is more than that of the low-molecular-weight siloxane at the base surface, and a spacing between the adjacent metal patterns is variable by deformation of the polydimethylsiloxane sheet.

13 Claims, 9 Drawing Sheets

(56) References Cited

U.S. PATENT DOCUMENTS

2011/0171480 A1* 7/2011 Mori et al. .................. 428/447
2012/0154793 A1* 6/2012 Pryce et al. .................. 356/51
2013/0240251 A1* 9/2013 Kaplan et al. ............... 174/254

* cited by examiner

POLYDIMETHYLSILOXANE SHEET, OPTICAL ELEMENT INCORPORATING THE SAME, AND MANUFACTURING METHOD THEREOF

BACKGROUND OF THE INVENTION

The present invention relates generally to a polydimethylsiloxane sheet, and more particularly to a polydimethylsiloxane sheet for the formation of a metal thin film and a metal pattern shaped as desired, an optical element having a plurality of nano-order metal patterns formed on a flexible resin substrate, and a manufacturing method thereof.

So far, polydimethylsiloxane (hereinafter often abbreviated as PDMS) sheets have been advantageously used in a variety of application fields inclusive of electronic and electric devices or the like because of excelling in heat resistance, cold resistance and weather resistance and having stabilized electric characteristics.

Optical elements having a diffraction grating formed on a glass substrate or the like have also been widely used so far in the art, and more recently, an optical element having a metal pattern formed on a flexible resin substrate has been proposed (the 56$^{th}$ Spring Meeting, 2009—The Japan Society of Applied Physics—by Oh Gyosei et. al. at University of Tsukuba, 1p-H-9). This optical element changes in the inter-metal pattern nano-order locations upon receipt of external force by the substrate, resulting in changes in the inter-metal pattern near-field interactions and, hence, optical responses. Another proposal has been made of an optical element having zero reflectivity at an interface with a substance without depending on the direction of polarization for 100% transmission of light (JP(A) 2006-350232). This optical element has a structure in which a plurality of magnetic resonators, each being a nano-structure wherein silver as a meta-material is C-shaped, are located on a glass substrate.

A problem with the conventional PDMS sheets, however, has been poor adhesion to metals. Another problem has been that when a PDMS sheet is placed on a silicon-containing substrate such as a glass substrate, a quartz substrate or a silicon substrate to form a metal thin film or a metal pattern of any desired shape thereon, or stored on that substrate over an extended period of time, it may stick to the substrate, making handleability and stability worse.

Being flexible and transparent to light, the PDMS sheet could also be used as a flexible resin substrate forming a part of such an optical element as set forth in the aforesaid non-patent publication. However, a problem with the direct formation of a metal pattern on the conventional PDMS sheet, however, has been that the metal pattern peels off and de-bonds due to repetitive application of external force on the PDMS sheet, because there is a weak adhesion power of the metal nano-structure to the PDMS sheet.

DISCLOSURE OF THE INVENTION

A primary object of the invention is to provide a PDMS sheet that has good adhesion to a metal thin film or a metal pattern of any desired shape and is improved in terms of handleability and stability, an optical element that is protected against the peeling or de-bonding of a metal pattern and so has high reliability, and has good handleability, and manufacturing methods thereof.

In order to accomplish such an object, the invention disclosed herein provides an optical element comprising a polydimethylsiloxane sheet having a pattern-formation surface defined by one surface and a base surface defined by another surface, and a plurality of metal patterns positioned on said pattern-formation surface, wherein, given a low-molecular-weight siloxane of a cyclic structure represented by $[—Si(CH_3)_2O—]_k$ where k is an integer of 3 to 20 inclusive, said polydimethylsiloxanecular-weight siloxane at said pattern-formation sheet has a structure in which the content of said low-mole surface is more than the content of said low-molecular-weight siloxane at said base surface, and a spacing between adjacent said metal patterns is variable by deformation of said polydimethylsiloxane sheet.

The invention also provides an optical element comprising a polydimethylsiloxane sheet having a pattern-formation surface defined by one surface and a base surface defined by another surface, and a plurality of metal patterns positioned said pattern-formation surface, wherein, given a low-molecular-weight siloxane of a cyclic structure represented by $[—Si(CH_3)_2O—]_k$ where k is an integer of 3 to 20 inclusive, said polydimethyl-siloxane sheet has a structure in which the content of said low-molecular-weight siloxane at said pattern-formation surface is more than the content of said low-molecular-weight siloxane at said base surface, and said metal patterns each comprise a substantially ring-form pattern having a notch in at least a part thereof, and a space of said notch is variable by deformation of said polydimethylsiloxane sheet.

In one embodiment of the invention, the aforesaid polydimethylsiloxane sheet comprises on at least said pattern-formation surface a high-content polydimethyl-siloxane layer containing said low-molecular-weight siloxane in an amount of 2,000 ppm or more and on at least said base surface a low-content polydimethyl-siloxane layer containing said low-molecular-weight siloxane in an amount of 1,000 ppm or less.

In another embodiment of the invention, said metal patterns contain any of Au, Ag, and Al as a main component.

In a further embodiment of the invention, there is an underlay metal layer present between said polydimethylsiloxane sheet and said metal patterns, wherein said underlay metal layer has the same pattern as said metal patterns, or there is an underlay metal layer present between said polydimethylsiloxane sheet and said metal patterns, wherein said underlay metal layer is present all over said pattern-formation surface of said polydimethylsiloxane sheet.

In a further embodiment of the invention, said underlay metal layer contains any of Cr, Ti, Ni, W and an oxide and nitride thereof as a main component.

In a further embodiment of the invention, said pattern-formation surface of said polydimethylsiloxane sheet has a surface average roughness Ra of 0.1 µm or less.

In such an inventive optical element as described above, the metal patterns are positioned on the high-content polydimethylsiloxane layer (pattern-formation surface) of the polydimethylsiloxane sheet; so the adhesion of the metal patterns to the polydimethyl-siloxane sheet is improved, making sure high reliability. In addition, the low-content polydimethylsiloxane layer (base surface) of the polydimethylsiloxane sheet is of low reactivity to a silicone-containing substrate such as a glass, quartz, or silicon substrate; so even when the polydimethylsiloxane sheet is placed and stored on such a substrate with its base surface abutting thereon, it is prevented from sticking thereto, making sure good handle-ability and stability.

Further, the invention provides a manufacturing method of the optical element of the invention, comprising a step of, given a low-molecular-weight siloxane of a cyclic structure represented by $[—Si(CH_3)_2O—]_k$ where k is an integer of 3 to 20 inclusive, coating a support substrate with a raw material for forming a low-content polydimethylsiloxane layer that contains said low-molecular-weight siloxane in a smaller amount to form a coating film for the low-content polydimethylsiloxane layer, a step of feeding a raw material for forming a high-content polydimethylsiloxane layer that contains said low-molecular-weight siloxane in a larger amount on said coating film for the low-content polydimethylsiloxane layer and pressing a mold substrate against said raw material thereby forming a coating film for the high-content polydimethylsiloxane layer between said mold substrate and said coating film for the low-content polydimethylsiloxane layer, after which said mold substrate is released from said coating film for the high-content polydimethylsiloxane layer, a step of curing said coating film for the low-content polydimethyl-siloxane layer and said coating film for the high-content polydimethylsiloxane layer into a polydimethylsiloxane sheet comprising a structure of the low-content polydimethylsiloxane layer and the high-content polydimethylsiloxane layer, a step of forming a plurality of metal patterns on a pattern-formation surface defined by said high-content polydimethylsiloxane layer of said polydimethylsiloxane sheet in such a way that a spacing between adjacent said metal patterns is 1,000 nm or less, and a step of releasing said polydimethylsiloxane sheet from said support substrate.

Further, the invention provides a manufacturing method of the optical element of the invention, comprising a step of, given a low-molecular-weight siloxane of a cyclic structure represented by [—Si(CH$_3$)$_2$O—], where k is an integer of 3 to 20 inclusive, coating a support substrate with a raw material for forming a low-content polydimethylsiloxane layer that contains said low-molecular-weight siloxane in a smaller amount to form a coating film for the low-content polydimethylsiloxane layer, a step of feeding a raw material for forming a high-content polydimethylsiloxane layer that contains said low-molecular-weight siloxane in a larger amount on said coating film for the low-content polydimethylsiloxane layer and pressing a mold substrate onto said raw material thereby forming a coating film for the high-content polydimethylsiloxane layer between said mold substrate and said coating film for the low-content polydimethylsiloxane layer, after which said mold substrate is released from the coating film for the high-content polydimethylsiloxane layer, a step of curing said coating film for the low-content polydimethylsiloxane layer and said coating film for the high-content poly-dimethylsiloxane layer into a polydimethylsiloxane sheet comprising a structure of the high-content polydimethyl-siloxane layer and the low-content polydimethylsiloxane layer, a step of forming a plurality of metal patterns on a pattern-formation surface defined by said high-content polydimethylsiloxane layer of said polydimethylsiloxane sheet, wherein said plurality of metal patterns each comprise a substantially ring-form pattern having a notch in at least a part thereof and a space of said notch is 1,000 nm or less, and a step of releasing said polydimethylsiloxane sheet from said support substrate.

In one embodiment of the invention, said low-content polydimethylsiloxane layer contains said low-molecular-weight siloxane in an amount of 1,000 ppm or less, and said high-content polydimethylsiloxane layer contains said low-molecular-weight siloxane in an amount of 2,000 ppm or more.

In another embodiment of the invention, said metal patterns are formed by forming a resist pattern on said pattern-formation surface of said polydimethylsiloxane sheet, then forming a metal layer on said pattern-formation surface via said resist pattern, and finally peeling off said resist pattern thereby lifting off the metal layer formed on the resist pattern.

In yet another embodiment of the invention, said metal patterns are formed by forming a metal layer on said pattern-formation surface of said polydimethyl-siloxane sheet, then forming a resist pattern on said metal layer, then etching said metal layer via said resist pattern, and finally peeling off said resist pattern.

In a further embodiment of the invention, an underlay metal layer is formed all over said pattern-formation surface of said polydimethylsiloxane sheet, after which said metal patterns are formed on said underlay metal layer or, alternatively, an underlay metal layer is formed all over said pattern-formation surface of said polydimethylsiloxane sheet, after which said metal patterns are formed on said underlay metal layer, and a portion of said underlay metal layer where said metal patterns are not formed is removed by etching.

With such a manufacturing method of the optical element of the invention as described above, the structure that is the polydimethylsiloxane sheet is formed, and the metal patterns are formed on the high-content polydimethylsiloxane layer (pattern-formation surface). This makes sure tighter adhesion of the metal patterns to the polydimethylsiloxane sheet, and allows the low-content polydimethylsiloxane layer forming a part of the structure to be positioned on the support substrate side so that the optical element can easily be released from the support substrate.

Yet further, the invention provides a polydimethyl-siloxane sheet comprising a structure that, given a low-molecular-weight siloxane of a cyclic structure represented by [—Si(CH$_3$)$_2$O—], where k is an integer of 3 to 20 inclusive, has on at least one surface a high-content polydimethylsiloxane layer containing said low-molecular-weight siloxane in a larger amount and on at least another surface a low-content polydimethylsiloxane layer containing said low-molecular-weight siloxane in a smaller amount, wherein said high-content polydimethyl-siloxane layer provides a work surface and said low-content polydimethylsiloxane layer provides a base surface.

In one embodiment of the invention, said high-content polydimethylsiloxane layer contains said low-molecular-weight siloxane in an amount of 2,000 ppm or more, and said low-content polydimethylsiloxane layer contains said low-molecular-weight siloxane in an amount of 1,000 ppm or less.

In another embodiment of the invention, said structure has a thickness in the range of 0.01 to 10 mm, and said low-content polydimethylsiloxane layer has a thickness in the range of 0.005 to 5 mm.

In yet another embodiment of the invention, said work surface has a surface average roughness Ra of 0.1 µm or less.

Because the high-content polydimethylsiloxane layer that is the work surface has so tight adhesion to metals, such an inventive polydimethylsiloxane sheet as described above is well compatible with the processing of metal thin films, metal patterns or the like so that it can be applied to optical elements, flexible image display devices, flexible lighting devices and so on. In addition, the low-content polydimethylsiloxane layer that is the base surface is of low reactivity to silicon-containing substrates such as glass substrates, quartz substrates, and silicon substrates so that even when the inventive polydimethylsiloxane sheet is placed and stored on such a substrate with the base surface abutting thereon, it is prevented from sticking to the substrate enough to make sure good handleability and stability.

Still further, the invention provides a manufacturing method of a polydimethylsiloxane sheet comprising a step of, given a low-molecular-weight siloxane of a cyclic structure represented by $[\text{—Si}(CH_3)_2O\text{—}]_k$ where k is an integer of 3 to 20 inclusive, coating a support substrate with a raw material for forming a low-content poly-dimethylsiloxane layer that contains said low-molecular-weight siloxane in a smaller amount to form a coating film for the low-content polydimethylsiloxane layer, a step of feeding a raw material for forming a high-content polydimethylsiloxane layer that contains the low-molecular-weight siloxane in a larger amount on said coating film for the low-content polydimethylsiloxane layer and pressing a mold substrate onto said raw material thereby forming a coating film for a high-content polydimethylsiloxane layer, thereby forming a coating film for the high-content polydimethylsiloxane layer between said mold substrate and said coating film for the low-content polydimethylsiloxane layer, after which said coating film for the high-content polydimethylsiloxane layer is released from said mold substrate, and a step of curing said coating film for the low-content polydimethylsiloxane layer and said coating film for the high-content polydimethylsiloxane layer into a polydimethyl-siloxane sheet comprising a structure of the low-content polydimethylsiloxane layer and the high-content polydimethylsiloxane layer, after which said structure is released from said support substrate.

In one embodiment of the invention, said low-content polydimethylsiloxane layer contains said low-molecular-weight siloxane in an amount of 1,000 ppm or less, and said high-content polydimethylsiloxane layer contains said low-molecular-weight siloxane in an amount of 2,000 ppm or more.

In such a manufacturing method of the inventive polydimethylsiloxane sheet as described above, the low-content polydimethylsiloxane layer is positioned on the support substrate side, notwithstanding the structure that is the polydimethylsiloxane sheet comprises the high-content polydimethylsiloxane layer having good adhesion to metals, so that the structure can easily be released from the support substrate. In addition, by proper determination of the shape of the mold substrate, any desired shape can be applied to the surface (work surface) of the high-content polydimethylsiloxane layer, making it possible to manufacture polydimethylsiloxane sheets depending on the purpose.

DETAILED EXPLANATION OF THE INVENTION

Embodiments of the invention are now explained with reference to the accompanying drawings.
[Polydimethylsiloxane Sheet]

Figure 1:
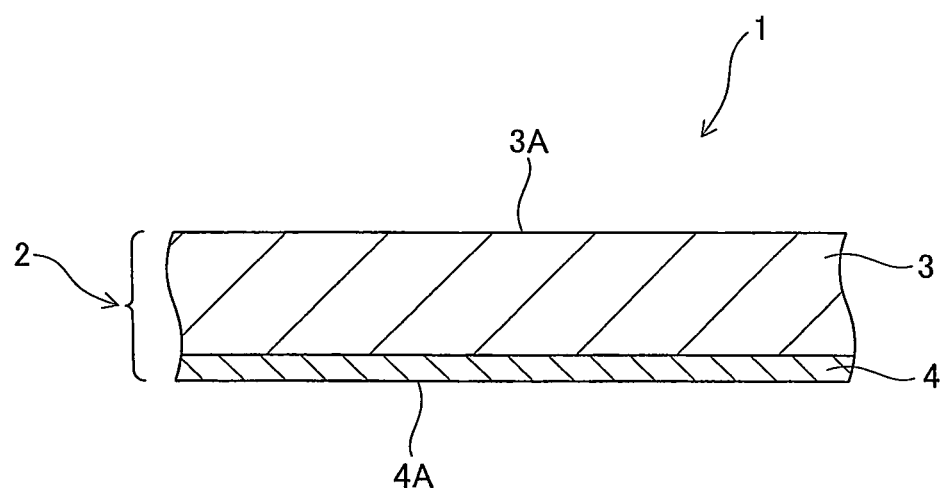
FIG. 1 is a fragmentary sectional view illustrative of one embodiment of the inventive polydimethylsiloxane sheet.

FIG. 1 is a fragmentary sectional view illustrative of one embodiment of the inventive polydimethylsiloxane (PDMS) sheet. As shown in FIG. 1, the inventive PDMS sheet generally shown by reference numeral 1 is made up of a structure 2 comprising a high-content PDMS layer 3 containing the low-molecular-weight siloxane in a larger amount and a low-content PDMS layer 4 containing the low-molecular-weight siloxane in a smaller amount. More specifically, the PDMS sheet 1 is made up of the structure 2 comprising the high-content PDMS layer 3 containing the low-molecular-weight siloxane in an amount of 2,000 ppm or more, preferably in the range of 5,000 to 30,000 ppm and the low-content PDMS layer 4 containing the low-molecular-weight siloxane in an amount of 1,000 ppm or less, preferably in the range of 0 to 500 ppm. Here the high-content PDMS layer 3 side of the structure 2 provides a work surface 3A for the formation of a metal thin film or a metal pattern of any desired shape, and the low-content PDMS layer 4 side provides a base surface 4A.

In the invention, the low-molecular-weight siloxane should have a cyclic structure represented by $[\text{—Si}(CH_3)_2O\text{—}]_k$ where k is an integer of 3 to 20 inclusive due to the facts that it is of more reactivity to the silicon-containing substrate than a high-molecular-weight siloxane, and that its adhesion to metals and its reactivity to the silicon-containing substrate are controllable by its content. It is here to be noted that the content of the low-molecular-weight siloxane may be measured by gas chromatography after extraction by acetone. This holds true for the low-molecular-weight siloxane and its content throughout the present disclosure.

As the content of the low-molecular-weight siloxane in the high-content PDMS layer 3 forming a part of the PDMS sheet 1 is less than 2,000 ppm, it is not preferable in that the adhesion to metals becomes insufficient, resulting in possible exfoliation and de-bonding of the metal thin film or the metal pattern of any desired shape formed on the high-content PDMS layer 3 (work surface 3A). As the content of the low-molecular-weight siloxane in the low-content PDMS layer 4 is greater than 1,000 ppm, on the other hand, it is again not preferable in that in the step of manufacturing the PDMS sheet 1 or in the processing step and storage state of the PDMS sheet 1, the low-content PDMS layer 4 (base surface 4A) may stick to the abutting substrate, for instance, a silicon-containing substrate such as a glass substrate, a quartz substrate, and a silicon substrate.

The inventive PDMS sheet 1 (structure 2) should have a thickness in the range of 0.01 to 10 mm, preferably 0.5 to 10 mm. As the thickness of the PDMS sheet 1 is less than 0.1 mm, it would render sheet manufacturing difficult because the high viscosity of the raw material PDMS gives rise to sheet thickness variations and sheet ruptures upon peeling from the support substrate during manufacturing. As the thickness of the PDMS sheet 1 is greater than 10 mm, on the other hand, it is not preferable in that post-processing presumed for optical elements as an example would become difficult.

The low-content PDMS layer 4 forming a part of the PDMS sheet 1 could have a thickness in the range of 0.005 to 5 mm, preferably 0.05 to 1 mm. As the thickness of the low-content PDMS layer 4 is less than 0.005 mm, there would be defects in some of the low-content PDMS layer 4, which might render it impossible to apply the low-content PDMS layer 4 all over the base surface 4A of the PDMS sheet 1. As the thickness of the low-content PDMS layer 4 is greater than 5 mm, on the other hand, it is not preferable because the function of the low-content PDMS layer 4 would not be enhanced any longer, and the manufacturing cost of the PDMS sheet 1 would increase as well.

The thickness of the high-content PDMS layer 3 forming a part of the PDMS sheet 1 is determined by setting the thickness of the PDMS sheet 1 and the thickness of the low-content PDMS layer 4 in the aforesaid range; there is no specific limitation on it. The PDMS sheet 1 comprising the aforesaid structure 2 is provided for the purpose of illustration alone; what is essentially needed here is that there is the high-content PDMS layer 3 present at the work surface 3A, and there is the low-content PDMS layer 4 present at the base surface 4A. In other words, materials different from the high-content and low-content PDMS layers 3 and 4 may exist between both layers 3 and 4 without departing from the purport disclosed herein. It is here to be noted that for the convenience of explanation, the terminology "layer" is used to tell the high-content PDMS layer 3 from the low-content PDMS layer 4; however, the invention disclosed herein should not be interpreted as being limited to what is illustrated in the drawings. To put it another way, the polydimethylsiloxane sheet according to one embodiment of the invention also embraces a structure having an ambiguous boundary between the high-content PDMS layer 3 and the low-content PDMS layer 4. That is, although there is some difficulty in discerning the high-content and low-content PDMS layers 3 and 4 as layers, respectively, yet the invention disclosed herein also encompasses a structure in which the content of the low-molecular-weight siloxane in the work surface 3A is 2,000 ppm or greater, and the content of the low-molecular-weight siloxane in the base surface 4A is 1,000 ppm or less.

The shape of the surface (work surface 3A) of the high-content PDMS layer 3 in the PDMS sheet 1 may optionally be determined depending on what purpose the PDMS sheet 1 is used for; for instance, when the PDMS sheet 1 is used for an optical element, that surface may be in a flat surface form having a surface average roughness Ra of 0.1 µm or less. It is here to be noted that the surface average roughness Ra may be measured under an atomic force microscope (AFM).

When the PDMS sheet 1 is used for an optical element, its light transmittance should be 80% or greater, preferably 90% or greater, more preferably 95% or greater. The light transmittance here may be measured by a spectrometer MCPD 2000 made by Otsuka Electronics Co., Ltd. The PDMS sheet 1 should preferably have a coefficient of elasticity of 100 kPa to 10 MPa in terms of tensile strength. The tensile strength here has been measured on a universal testing machine Instron 5565 and expressed in terms of the rupture strength of a dumbbell test piece.

Such inventive PDMS sheet 1 may be applied to optical elements, flexible image display devices, flexible lighting devices or the like, because the high-content PDMS layer 3 that is the work surface 3A shows good adhesion to metals, making sure good processability for metal thin films, metal patterns or the like. In addition, the low-content PDMS layer 4 that is the base surface 4A is of low reactivity to silicon-containing substrates such as glass substrates, quartz substrates, and silicon substrates so that even when the PDMS sheet 1 is placed and stored with the base surface abutting upon them, it is prevented from sticking to them, making sure good handleability and stability.

The aforesaid embodiment is given by way of exemplification but not by way of limitation.

[Manufacturing Method of the Polydimethylsiloxane Sheet]

FIGS. 2A to 2F are a set of step diagrams illustrative of one embodiment of the manufacturing method of the inventive polydimethylsiloxane sheet wherein the PDMS sheet 1 shown in FIG. 1 is used as an example.

Figure 2A:
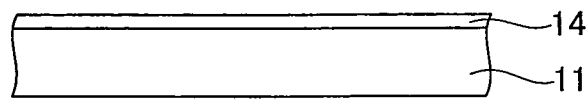
FIGS. 2A to 2F are a set of step diagrams illustrative of one embodiment of the manufacturing method of the inventive polydimethylsiloxane sheet.
Figure 2B:
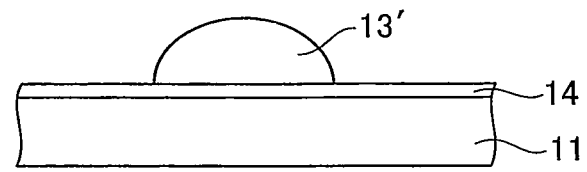
Figure 2C:
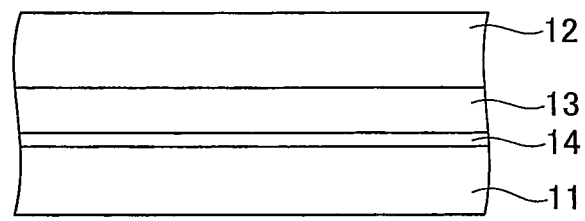

First, the raw material for forming the low-content PDMS layer 4 is coated on a support substrate 11 to form a coating film 14 for the low-content PDMS layer (FIG. 2A). Given the low-molecular-weight siloxane of a cyclic structure represented by [—Si(CH$_3$)$_2$O—]$_k$ where k is an integer of 3 to 20 inclusive, the raw material used is a PDMS containing the low-molecular-weight siloxane in a smaller amount, for instance, a PDMS that has a low-molecular-weight siloxane content in the range of 1,000 ppm or less, preferably 0 to 500 ppm. For the support substrate 11, there may be a rigid substrate used such as a glass, quartz, silicon or metal substrate, and the surface to be provided with the coating film 14 should preferably be a flat surface having a surface average roughness Ra of, for instance, 0.1 µm or less in consideration of the thickness uniformity of the coating film 14 and the releasing feature of the structure 2 from the support substrate 11 in a later step. The coating film 14 may be formed on the support substrate 11 as by spin coating, brush coating or other suitable coating, and the thickness of the coating film 14 may optionally be determined such that the thickness of the low-content PDMS layer 4 cured and formed in the later step comes under the range of 0.005 to 5 mm, preferably 0.05 to 1 mm. As the coating film 14 has a thickness such that the thickness of the low-content PDMS layer 4 cured and formed in the later step runs short of 0.005 mm, it may possibly give rise to defects in some of the low-content PDMS layer 4 formed, which would in turn render it difficult to release the structure 2 from the support substrate 11 in the later step, and cause the structure 2 to rupture or otherwise break. As the coating film 14 has a thickness such that the thickness of the low-content PDMS layer 4 exceeds 5 mm, on the other hand, it is not preferable in that the function of the low-content PDMS layer 4 is not enhanced any longer, and the manufacturing cost of the PDMS sheet 1 rises as well.

Figure 2D:
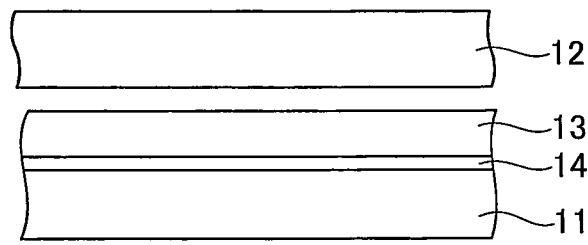
Figure 2E:
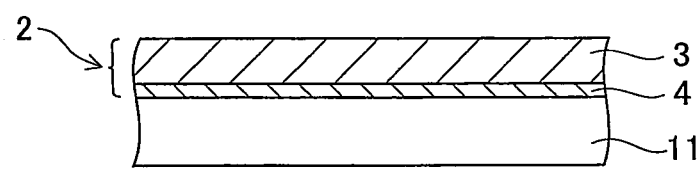
Figure 2F:
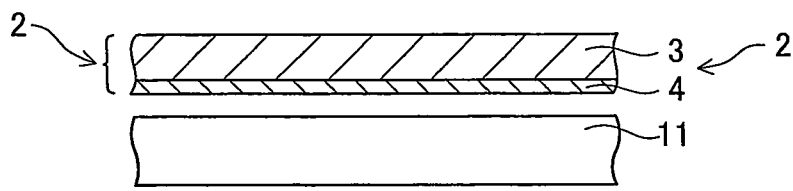

Next, a raw material 13' for the formation of the high-content PDMS layer 3 is fed onto the coating film 14 for the low-content PDMS layer (FIG. 2B), and a mold substrate 12 is then pressed against the raw material 13' thereby forming a coating film 13 for the high-content PDMS layer between the mold substrate 12 and the coating film 14 for the low-content PDMS layer (FIG. 2C), after which the coating film 13 is released from the mold substrate 12 (FIG. 2D). The raw material 13' used here is a PDMS containing the low-molecular-weight siloxane in a larger amount, for instance, in the range of 2,000 ppm or greater, preferably 5,000 to 30,000 ppm. By way of example but not by way of limitation, this raw material 13' may be fed onto the coating film 14 for the low-content PDMS layer, for instance, in a droplet form by means of a dispenser. The thickness of the coating film 13 may optionally be set such that the thickness of the PDMS sheet 1 (structure 2) formed in a later step comes under the range of 0.01 to 10 mm, preferably 0.5 to 10 mm. As the coating film 13 has a thickness such that the thickness of the structure 2 becomes less than 0.1 mm, it would render sheet manufacturing difficult because the high viscosity of the raw material 13' would give rise to thickness variations and ruptures of the structure 2 upon peeling from the support substrate 11. As the coating film 13 has a thickness such that the thickness of the structure 2 becomes greater than 10 mm, on the other hand, it is not preferable in that the later step presumed for optical elements as an example would become difficult.

The mold substrate 12 is operable to turn the raw material 13' into the coating film 13, and to determine the shape of the surface (work surface 3A) of the high-content PDMS layer 3 formed in the later step. For such mold substrate 12, there may be a rigid substrate used such as a glass, quartz, silicon or metal substrate, and the shape of the surface of that mold substrate to be pressed against the raw material 13' (coating film 13) may optionally be determined depending on the shape of the surface (works surface 3A) of the end high-content PDMS layer 3. For instance, when the PDMS sheet 1 is presumed for an optical element, that surface should preferably be a flat surface having a surface average roughness Ra of up to 0.1 μm.

Finally, the coating film 13 for the high-content PDMS layer and the coating film 14 for the low-content PDMS layer are cured into the structure 2 made up of the high-content and low-content PDMS layers 3 and 4 (FIG. 2E), after which the structure 2 is released from the support substrate 11 (FIG. 2F), whereby the inventive PDMS sheet 1 is obtained.

In order to form the coating film 13 for the high-content PDMS layer and the coating film 14 for the low-content PDMS layer in the aforesaid embodiment of the manufacturing method of the PDMS sheet, reliance may also placed on two such methods as mentioned below. Referring to the first method, after the formation of the coating film 14 for the low-content PDMS layer, the raw material 13' for the formation of the high-content PDMS layer 3 is fed onto the coating film 14, and the mold substrate 12 is then pressed onto the material 13' to form the coating film 13 for the high-content PDMS layer. In that state, the coating film 13 for the high-content PDMS layer and the coating film 14 for the low-content PDMS layer are semi-cured. Finally, the coating film 13 for the high-content PDMS layer is released from the mold substrate 12 before the coating film 13 for the high-content PDMS layer and the coating film 14 for the low-content PDMS layer are full-cured. Referring to the second method, the coating film 14 for the low-content PDMS layer is formed and semi-cured. Then, the raw material 13' for the formation of the high-content PDMS layer 3 is fed onto the semi-cured coating film 14 for the low-content PDMS layer, and the mold substrate 12 is pressed onto that material 13' to form the coating film 13 for the high-content PDMS layer. In that state, the coating film 13 is semi-cured (the coating film 14 for the low-content PDMS layer may remain either full-cured or semi-cured). Finally, the coating film 13 for the high-content PDMS layer is released from the mold substrate 12 before the coating film 13 for the high-content PDMS layer is full-cured. In accordance with these first and second methods, it is highly unlikely that the coating film 13 for the high-content PDMS layer may remain tightly fixed to the mold substrate 12 because the mold substrate 12 is peeled off while the coating film 13 for the high-content PDMS layer is in the semi-cured state. By forming the coating film 13 for the high-content PDMS layer in a state where the coating film 14 for the low-content PDMS layer remains hardly cured or semi-cured, it is possible to enhance the strength of the structure because the boundary portions between both the coating layers are entangled up. Note here that semi-curing may be achieved by letting the coating film alone at normal temperature or heating it moderately.

Such inventive PDMS sheet manufacturing methods make sure the structure 2 is easily releasable from the support plate 11, because the low-content PDMS layer 4 is positioned on the support substrate 11 side, notwithstanding the structure 2 that is the PDMS sheet 1 comprises the high-content PDMS layer 3 showing good adhesion to metals. A problem with conventional PDMS sheet manufacturing is that handleability goes worse during manufacturing processes, because the PDMS sheet is released from the support substrate and then cured prior to the curing of the PDMS by heating. That problem can be overcome by the invention disclosed herein.

By optionally determining the shape of the mold substrate 12 according to the invention, it is possible to impart any desired shape to the surface (work surface 3A) of the high-content PDMS layer, thereby manufacturing PDMS sheets depending on what purpose they are used for.

The aforesaid embodiments are given for the sake of exemplification, so the invention is not limited to them whatsoever. For instance, when the PDMS sheet 1 is made up of a structure further comprising between the high-content and low-content PDMS layers 3 and 4 a resinous material different from both the layers, other resinous materials as desired may be fed onto the coating film 14 for the low-content PDMS layer, onto which the raw material 13' for the formation of the high-content PDMS layer 3 is fed.

[Optical Element]

Figure 3:
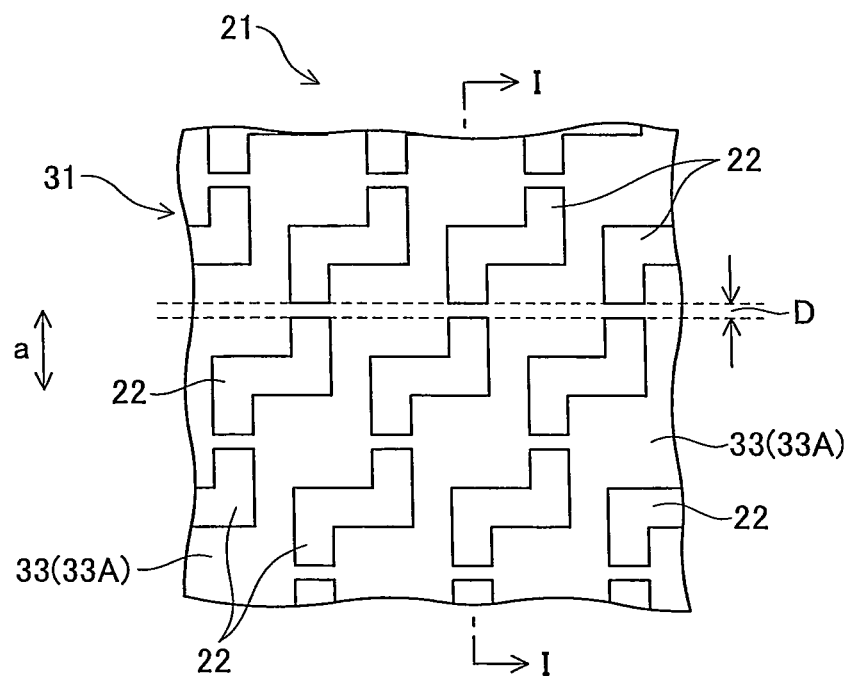
FIG. 3 is a fragmentary plan view of one embodiment of the inventive optical element.
Figure 4:
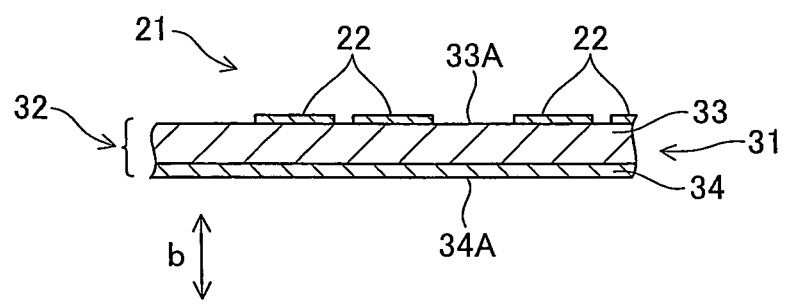
FIG. 4 is a longitudinally sectioned view of the optical element shown in FIG. 3, as taken on I-I line.

FIG. 3 is a fragmentary plan view illustrative of one embodiment of the optical element according to the invention, and FIG. 4 is a longitudinally sectioned view of the optical element shown in FIG. 3 as taken on I-I line. As depicted in FIGS. 3 and 4, the inventive optical element generally indicated by reference numeral 21 comprises a polydimethylsiloxane (PDMS) sheet 31 having a pattern-formation surface 33A defined by one surface and a base surface 34A defined by another surface, and a plurality of metal patterns 22 positioned on the pattern-formation surface 33A.

The PDMS sheet 31 transmits light and has flexibility; its light transmittance is at least 80%, preferably at least 90%, more preferably at least 95%, and its coefficient of elasticity is in the range of 100 kPa to 10 MPa in terms of tensile strength. Given a low-molecular-weight siloxane having a cyclic structure represented by [—Si(CH$_3$)$_2$O—]$_k$ where k is an integer of 3 to 20 inclusive, such PDMS sheet 31 is made up of a structure 32 comprising a high-content PDMS layer 33 containing the low-molecular-weight siloxane in a larger amount and a low-content PDMS layer 34 containing the low-molecular-weight siloxane in a smaller amount. More specifically, the PDMS sheet 31 is made up of the structure 32 comprising the high-content PDMS layer 33 containing the low-molecular-weight siloxane in an amount of 2,000 ppm or more, preferably in the range of 5,000 to 30,000 ppm and the low-content PDMS layer 34 containing the low-molecular-weight siloxane in an amount of 1,000 ppm or less, preferably in the range of 0 to 500 ppm. Here the high-content PDMS layer 33 side of the structure 32 provides the pattern-formation surface 33A, and the low-content PDMS layer 34 side provides the base surface 34A. Being equivalent to the aforesaid inventive PDMS sheet 1 and the work surface 3A of the PDMS sheet 1, the PDMS sheet 31 and the pattern-formation surface 33A will not be discussed in anymore detail. The PDMS sheet 31 comprising the aforesaid structure 32 is provided for the purpose of illustration alone; what is essentially needed here is that there is the high-content PDMS layer 33 present on the pattern-formation surface 33A, and there is the low-content PDMS layer 34 present on the base surface 34A. In other words, materials different from the high-content and low-content PDMS layers 33 and 34 may exist between both layers 3 and 4 without departing from the purport disclosed herein.

A plurality of metal patterns 22 positioned on the pattern-formation surface 33A of the PDMS sheet 31 make up a metal nano-structure that has such a shape as to have rectangular projections at both ends of a rectangle, as shown. Depending on the spacing D between the most proximal metal patterns among such metal patterns 22, there is a change in the degree of near-field light interaction occurring across the metal nano-structure. Such spacing D may optionally be set depending on the wavelength of light applied to the optical element, usually at 1,000 nm or less. In order to have near-field light interaction to visible light, that spacing D should preferably be set in the range of 200 to 500 nm. Although the individual metal patterns 22 may optionally be sized, that size should preferably be 1,000 nm or less. Such metal patterns 22 may contain as a main component, for instance, any of Au, Ag and Al, and have a thickness in the range of 50 to 1,000 nm. The "main component" referred to herein is understood to mean the one accounting for at least 50% by weight of the ingredients.

Figure 5:
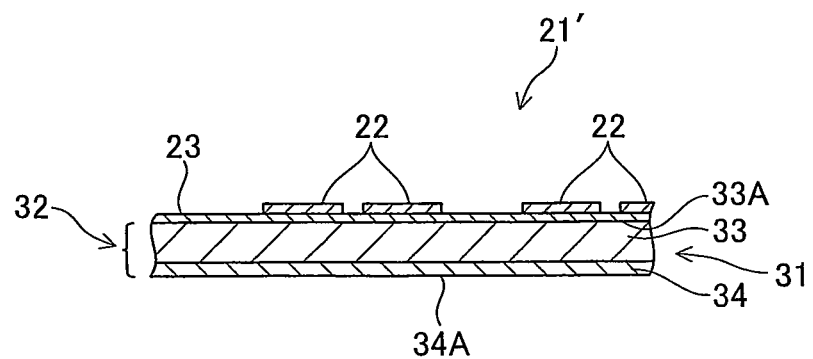
FIG. 5 is a longitudinally sectioned view, as in FIG. 4, of another embodiment of the inventive optical element.
Figure 6:
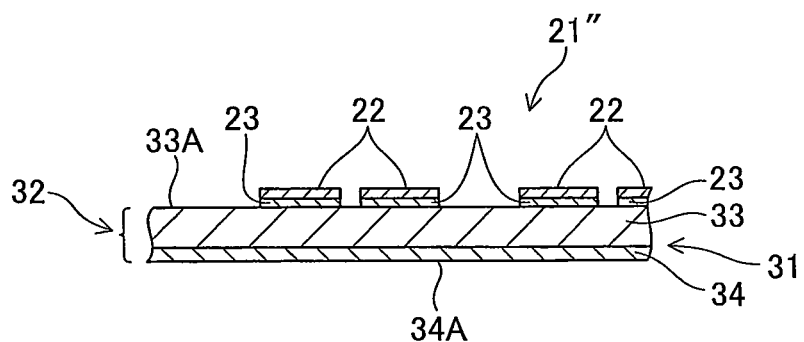
FIG. 6 is a longitudinally sectioned view, as in FIG. 4, of yet another embodiment of the inventive optical element.

As shown in FIG. 5, the aforesaid inventive optical element may be modified into an optical element 21' having an underlay metal layer 23 all over the pattern-formation surface 33A of the PDMS sheet 31, with the metal patterns 22 positioned on that underlay metal layer 23. Alternatively, as shown in FIG. 6, it may be modified into an optical element 21" having the metal patterns 22 on the pattern-formation surface 33A via an underlay metal layer 23 subjected to the same patterning as the metal patterns 22. Such underlay metal layer 23 is provided for the purpose of making further improvements in the adhesion between the PDMS sheet 31 and the metal patterns 22. The underlay metal layer 23 may optionally be made up of a material without detrimental to the operation and function of the optical element; for instance, it main contain as a main component any of Cr, Ti, Ni, W and an oxide or nitride thereof. The underlay metal layer 23 may have a thickness typically in the range of 1 to 5 nm.

Taking the optical element 21 shown in FIGS. 3 and 4 as an example, the operation of the inventive optical element is now explained with reference to FIG. 7.

Figure 7:
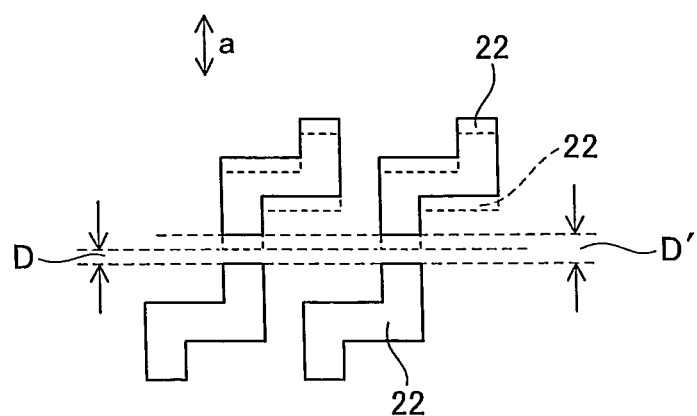
FIG. 7 is illustrative of how the inventive optical element shown in FIG. 3 operates.

As the optical element 21 receives external bending force such that, for instance, the side of the metal patterns 22 (the pattern-formation surface 33A) projects out with stretching force acting in a direction indicated by a double-action arrow a in FIGS. 3 and 7, it causes the spacing between the adjacent metal patterns 22 to widen from D to D'. Such a change in the spacing between the adjacent metal patterns 22 ends up with a change in the near-field light interaction occurring between the adjacent metal patterns 22. In turn, this causes light vertically incident on the optical element 21 (in the direction indicated by a double-action arrow b in FIG. 4) to change in its polarization state. By making use of such a function of the optical element 21 and a polarizing filter, that optical element can be used as, for example, a photonic switch operable to put light on and off. If the spacing D between the adjacent metal patterns 22 is designed to come within the visible light range (400 to 700 nm), it is then possible to change the spacing D between the metal patterns 22 by the application of predetermined external force, thereby changing the polarization of incident light incident in the visible light range. Thus, the inventive optical element can make the range of use wider than could be achieved with conventional elements using a glass, quartz or other substrate.

It is here to be noted that the external force applied to the optical element 21 to change the spacing between the adjacent metal patterns 22 is not limited to bending force; for instance, pulling force may be given to the PDMS sheet 31 to stretch it in the direction indicated by the double-action arrow a.

Figure 8:
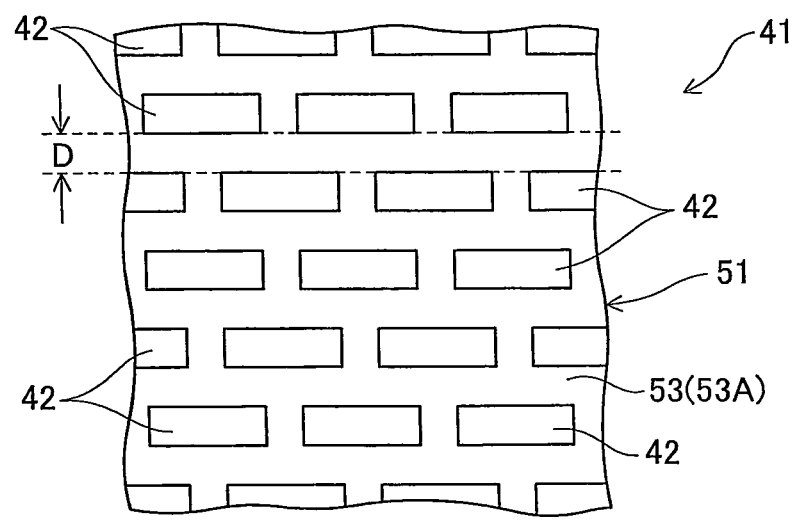
FIG. 8 is a fragmentary plan view of a further embodiment of the inventive optical element.

FIG. 8 is a fragmental plan view illustrative of another embodiment of the inventive optical element. As shown in FIG. 8, the inventive optical element generally indicated by reference numeral 41 is comprised of a PDMS sheet 51 having a pattern-formation surface 53A defined by one surface and a base surface defined by another surface, and a plurality of metal patterns 42 positioned on a high-content PDMS layer 53 (pattern-formation surface 53A) of the PDMS sheet 51.

Being similar to the PDMS sheet 31 that forms the aforesaid optical element 21, the PDMS sheet 51 that forms the optical element 41 will not be discussed in anymore detail.

A plurality of metal patterns 42 positioned on the pattern-formation surface 53A of the PDMS sheet 51 make up a metal nano-structure wherein rectangular patterns are arrayed with longer sides lying proximate to one another, as shown. Depending on the spacing D between the most proximate metal patterns among such metal patterns 42, there is a change in the degree of near-field light interaction occurring across the metal nano-structure. Such spacing D may optionally be set depending on the wavelength of light applied to the optical element, usually at 1,000 nm or less. In order to have near-field light interaction to visible light, that spacing D should preferably be set in the range of 200 to 500 nm. Although the individual metal patterns 42 may optionally be sized, that size should preferably be 1,000 nm or less. Such metal patterns 42 may again be formed of a material similar to that of the aforesaid metal patterns 22.

The optical element 41, too, may have an underlay metal layer between the pattern-formation surface 53A of the PDMS sheet 51 and the metal patterns 42, as is the case with the aforesaid optical elements 21' and 22".

As external force is applied to such optical element 41, it brings about a change in the spacing D between the adjacent metal patterns 42 as is the case with the aforesaid optical element 21, causing a change in the near-field light interaction occurring between the adjacent metal patterns 42.

Other embodiments of the inventive optical element are now explained with reference to FIGS. 9 to 12 showing an optical element functioning as a meta-material.

Figure 9:
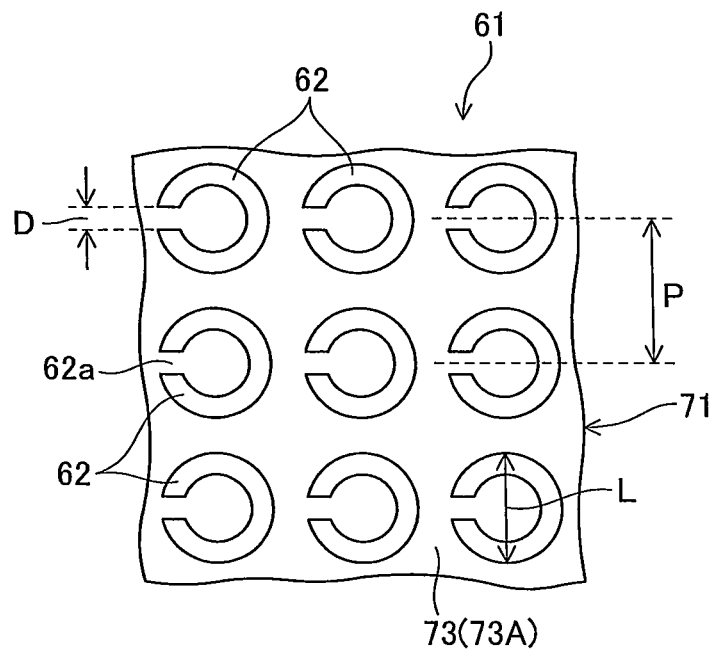
FIG. 9 is a fragmentary plan view of a further embodiment of the inventive optical element.
Figure 10:
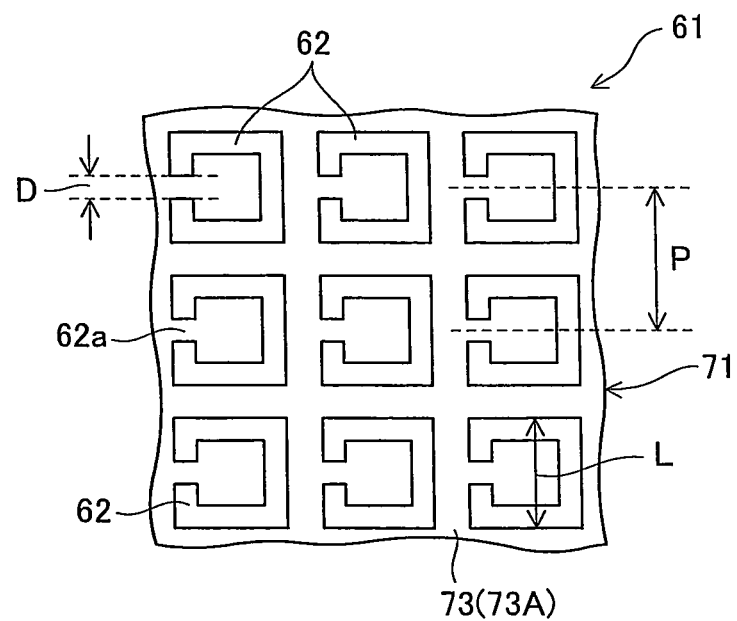
FIG. 10 is a fragmentary plan view of a further embodiment of the inventive optical element.

FIG. 9 is a fragmentary plan view illustrative of one embodiment of the inventive optical element functioning as a meta-material. As shown in FIG. 9, the inventive optical element generally indicated by reference numeral 61 comprises a PDMS sheet 71 having a pattern-formation surface 73A defined by one surface and a base surface defined by another surface, and a plurality of metal patterns 62 positioned on a high-content PDMS layer 73 (pattern-formation surface 73A) of the PDMS sheet 71.

Being similar to the PDMS sheet 31 that forms a part of the aforesaid optical element 21, the PDMS sheet 71 that forms a part of the optical element 61 will not be discussed in anymore detail.

A plurality of metal patterns 62 positioned on the pattern-formation surface 73A of the PDMS sheet 71 make up a metal nano-structure in which substantially ring-form patterns, each one having one notch 62a, are arrayed as shown. Depending on the notch space D of the notch 62a in each metal pattern 62, there is a change in the degree of near-field light interaction occurring across the metal nano-structure. Such spacing D may optionally be set depending on the wavelength of light applied to the optical element, usually at 1,000 nm or less. In order to have near-field light interaction to visible light, that spacing D should preferably be set in the range of 200 to 500 nm. Although the dimension L of each metal pattern 62 and the array pitch P of the metal patterns 62 may optionally be determined, yet L and P should preferably be 1,000 nm or less. The "substantially ring-form" used herein is understood to refer to a ring that generally takes on an annular form albeit having at least one notch, and the "annular form" is understood to refer to a variety of forms inclusive of an annular ring, a square ring, and a polygonal ring; so an array of such substantially ring-form patterns may be an array of square rings typically shown in FIG. 10, each one having one notch 62a. Such metal patterns 62 may be formed of the same material as the aforesaid metal pattern 22 is formed of.

The optical element 61, too, may have an underlay metal layer between the pattern-formation surface 73A of the PDMS sheet 71 and the metal patterns 62, as is the case with the aforesaid optical elements 21' and 22".

As external force is applied to such optical element 61, it brings about a change in the notch space D of the notch 62a in each substantially ring-form metal pattern 62 as is the case with the aforesaid optical element 21, causing a change in the near-field light interaction occurring across the metal nano-structure.

Figure 11:
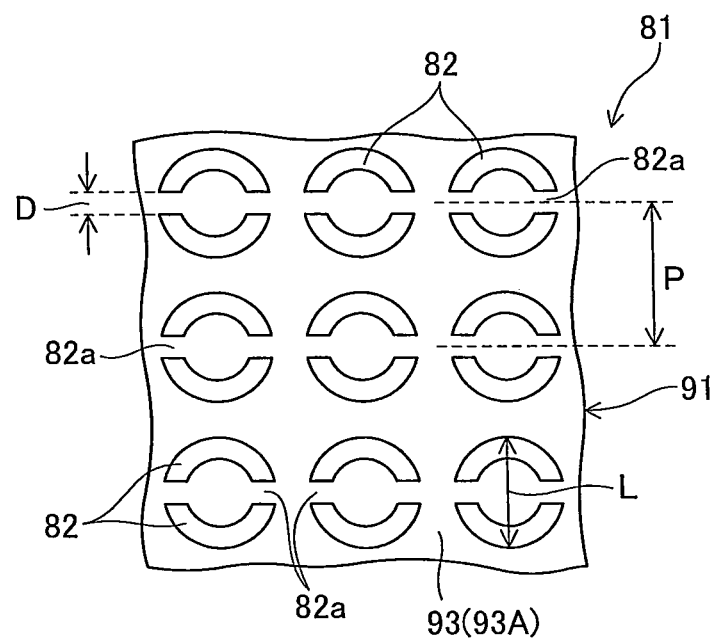
FIG. 11 is a fragmentary plan view of a further embodiment of the inventive optical element.
Figure 12:
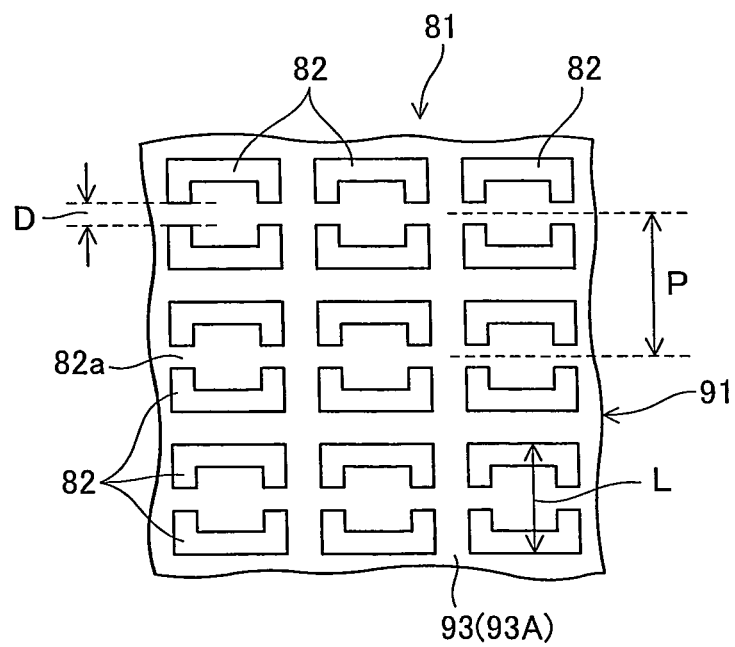
FIG. 12 is a fragmentary plan view of a further embodiment of the inventive optical element.

FIG. 11 is a fragmentary plan view illustrative of another embodiment of the inventive optical element functioning as a meta-material. As shown in FIG. 11, the inventive optical element generally indicated by reference numeral 81 comprises a PDMS sheet 91 having a pattern-formation surface 93A defined by one surface and a base surface defined by another surface, and a plurality of metal patterns 82 positioned on a high-content PDMS layer 93 (pattern-formation surface 93A) of the PDMS sheet 91.

Being similar to the PDMS sheet 31 that forms a part of the aforesaid optical element 21, the PDMS sheet 91 that forms a part of the optical element 81 will not be discussed in anymore detail.

A plurality of metal patterns 82 positioned on the pattern-formation surface 93A of the PDMS sheet 91 make up a metal nano-structure in which substantially ring-form patterns, each one having two notches 82a and 82a, are arrayed as shown. Depending on the notch space D of the notches 82a and 82a in each metal pattern 82, there is a change in the degree of near-field light interaction occurring across the metal nano-structure. Such notch space D may optionally be set depending on the wavelength of light applied to the optical element, usually at 1,000 nm or less. In order to have near-field light interaction to visible light, that space D should preferably be set in the range of 200 to 500 nm. Although the dimension L of each metal pattern 82 and the array pitch P of the metal patterns 82 may optionally be determined, yet L and P should preferably be 1,000 nm or less. The metal patterns 82 may also be formed by an array of square rings, each one having two notches 82a and 82a as typically shown in FIG. 12. Such metal patterns 82 may be formed of the same material as the aforesaid metal pattern 22 is formed of.

The optical element 81, too, may have an underlay metal layer between the pattern-formation surface 93A of the PDMS sheet 91 and the metal patterns 82, as is the case with the aforesaid optical elements 21' and 22".

As external force is applied to such optical element 81, it brings about a change in the notch space D of the notches 82a and 82a in each substantially ring-form metal pattern 82 as is the case with the aforesaid optical element 21, causing a change in the near-field light interaction occurring across the metal nano-structure.

Such an inventive optical element has ever higher reliability, because the metal patterns 22, 42, 62, 82 are positioned on the high-content PDMS layer 33, 53, 73, 93 (pattern-formation surface) so that there is good adhesion achievable between the metal patterns and the PDMS sheet. The low-content PDMS layer 34 (base surface 34A) of the PDMS sheet is of low reactivity to a silicon-containing substrate such as a glass, quartz, and silicon substrate so that even when it is placed and stored with its base surface abutting on that substrate, it is prevented from sticking to the substrate, making sure good handleability and stability.

The aforesaid embodiments are given by way of exemplification; so the invention is not limited thereto whatsoever. For instance, the aforesaid optical elements 61 may be stacked one upon another into the inventive optical element. In that case, the positions of the notches 62a in the substantially ring-form metal patterns 62 on the optical elements forming the layers may be aligned in the stacking direction, or the positions of the notches 62a may be displaced for each one layer or depending on multiple layers. Alternatively, the positions of the notches 62a may be disposed at random for each one layer. How many optical elements, each one having such structure, are stacked together may optionally be determined depending on the optical characteristics demanded, what purpose the optical elements are used for, or the like. The optical element of such stacked structure may also be set up using the aforesaid optical element 81.

[Manufacturing Method of the Optical Element]

FIGS. 13A to 13E, and FIGS. 14A to 14D are a set of step diagrams illustrative of one embodiment of the inventive optical element, wherein the optical element 21 shown in FIGS. 3 and 4 is used as an example.

Figure 13A:
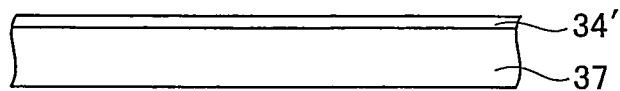
FIGS. 13A to 13E are a set of step diagrams illustrative of one embodiment of the manufacturing method of the inventive optical element.
Figure 13B:
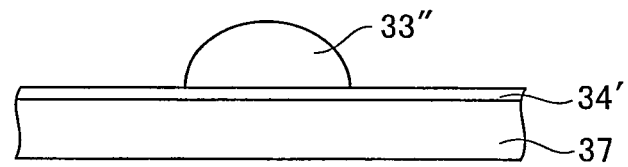
Figure 13C:
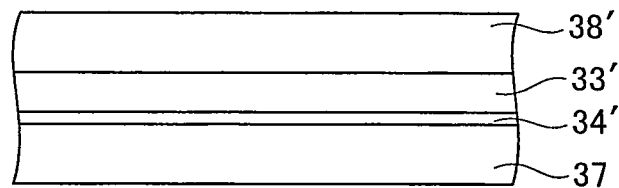

In the manufacturing method of the inventive optical element, first of all, a raw material for the formation of a low-content PDMS layer 34 is coated on a support substrate 37 to form a coating film 34' for the low-content PDMS layer (FIG. 13A). Given the low-molecular-weight siloxane of a cyclic structure represented by [—Si(CH$_3$)$_2$O—]$_k$ where k is an integer of 3 to 20 inclusive, the raw material used is a PDMS containing the low-molecular-weight siloxane in a smaller amount, for instance, a PDMS that has a low-molecular-weight siloxane content in the range of 1,000 ppm or less, preferably 0 to 500 ppm. For the support substrate 37, there may be a rigid substrate used such as a glass, quartz, silicon or metal substrate, and the surface to be provided with the coating film 34' should preferably be a flat surface having a surface average roughness Ra of, for instance, 0.1 µm or less in consideration of the thickness uniformity of the coating film 34' and the releasing feature of the structure 32 from the support substrate in a later step.

The coating film 34' may be formed on the support substrate 37 as by spin coating, brush coating or other suitable coating, and the thickness of the coating film 34' may optionally be determined such that the thickness of the low-content PDMS layer 34 cured and formed in the later step comes under the range of 0.005 to 5 mm, preferably 0.05 to 1 mm. As the coating film 34' has a thickness such that the thickness of the low-content PDMS layer 34 cured and formed in the later step runs short of 0.005 mm, it may possibly give rise to defects in some of the low-content PDMS layer 34 formed, which would in turn render it difficult to release the structure 32 from the support substrate 37 in the later step, and cause the structure 32 to rupture or otherwise break. As the coating film 34' has a thickness such that the thickness of the low-content PDMS layer 34 exceeds 5 mm, on the other hand, it is not preferable in that the function of the low-content PDMS layer 34 would not be enhanced any longer, and the manufacturing cost of the PDMS sheet 21 rises as well.

Figure 13D:
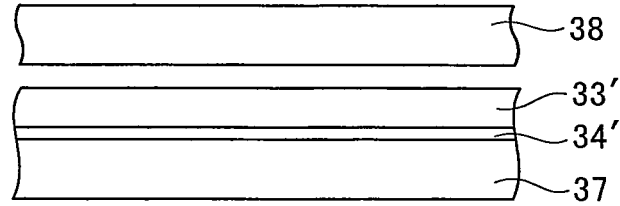

Next, a raw material 33" for the formation of the high-content PDMS layer 33 is fed onto the coating film 34' for the low-content PDMS layer (FIG. 13B), and a mold substrate 38 is then pressed against that raw material 33" thereby forming a coating film 33' for the high-content PDMS layer between the mold substrate 38 and the coating film 34' for the low-content PDMS layer (FIG. 13C), after which the coating film 33' is released from the mold substrate 38 (FIG. 13D). The raw material 33" used here is a PDMS containing the low-molecular-weight siloxane in a larger amount, for instance, in the range of 2,000 ppm or greater, preferably 5,000 to 30,000 ppm. By way of example but not by way of limitation, this raw material 33" may be fed onto the coating film 14 for the low-content PDMS layer, for instance, in a droplet form by means of a dispenser. The thickness of the coating film 33' may optionally be set such that the thickness of the PDMS sheet 31 (structure 32) formed in a later step comes under the range of 0.01 to 10 mm, preferably 0.5 to 10 mm. As the coating film 33' has a thickness such that the thickness of the structure 32 becomes less than 0.1 mm, it would render sheet manufacturing difficult because the high viscosity of the raw material 33" would give rise to thickness variations and ruptures of the structure 32 upon peeling from the support substrate 37. As the coating film 33' has a thickness such that the thickness of the structure 32 becomes greater than 10 mm, on the other hand, it is not preferable in that the formation of the metal patterns 22 in the later step would become difficult.

The mold substrate 38 is operable to turn the raw material 33" into the coating film 33', and to determine the shape of the surface (work surface 33A) of the high-content PDMS layer 33 formed in the later step. For such mold substrate 38, there may be a rigid substrate used such as a glass, quartz, silicon or metal substrate, and the shape of the surface of that mold substrate to be pressed against the raw material 33" (coating film 33') should preferably be a flat surface having a surface average roughness Ra of 0.1 μm or less.

Figure 13E:
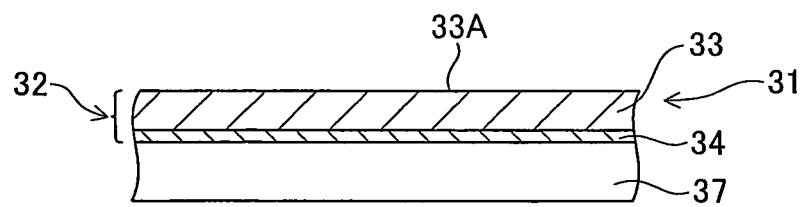

Finally, the coating film 33' for the high-content PDMS layer and the coating film 34' for the low-content PDMS layer are cured to form on the support substrate 37 the structure 32 made up of the high-content and low-content PDMS layers 33 and 34 (FIG. 13E).

In the aforesaid manufacturing embodiment, the coating film 33' for the high-content PDMS layer may be either hardly cured or semi-cured upon a releasing of the coating film 33' from the mold substrate 38 (FIG. 13D). At this time, the coating film 34' for the low-content PDMS layer may be either full-cured or semi-cured. For instance, the coating film 34' for the low-content PDMS layer may have been semi-cured for the formation of the coating film 33' for the high-content PDMS layer, in which case the boundary portions between the coating film 34' for the low-content PDMS layer and the coating film 33' for the high-content PDMS layer are entangled up thereby enhancing the strength of the structure 32.

Figure 14A:
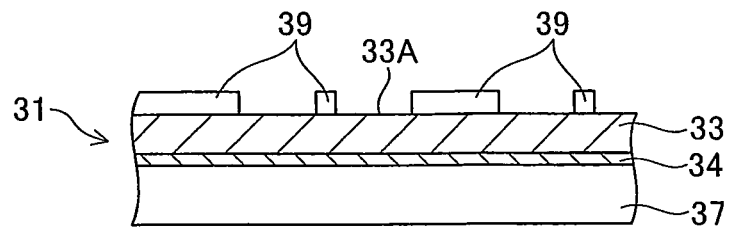
FIGS. 14A to 14D are a set of step diagrams illustrative of one embodiment of the manufacturing method of the inventive optical element.
Figure 14B:
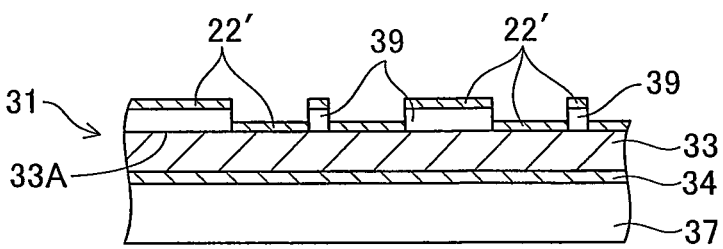

Then, a resist pattern 39 is formed on the surface (pattern-formation surface 33A) of the high-content PDMS layer 33 in the structure 32 (FIG. 14A), and a metal layer 22' is formed in such a way as to cover that resist pattern 39 (FIG. 14B). For instance, the resist pattern 39 may be formed by photolithography using a photo-sensitive resist, and the metal layer 22' may be formed by means of vacuum film-formation processes such as sputtering or vacuum evaporation using a material containing Au, Ag, Al or the like as a main component, with a thickness in the range of 50 to 1,000 nm.

Figure 14C:
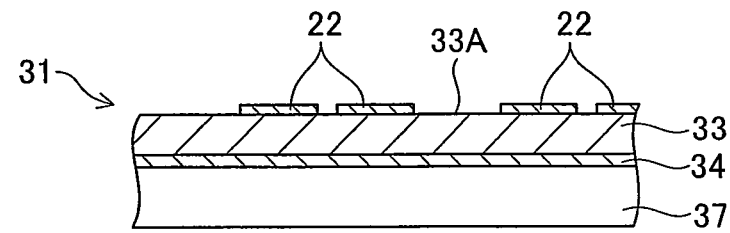
Figure 14D:
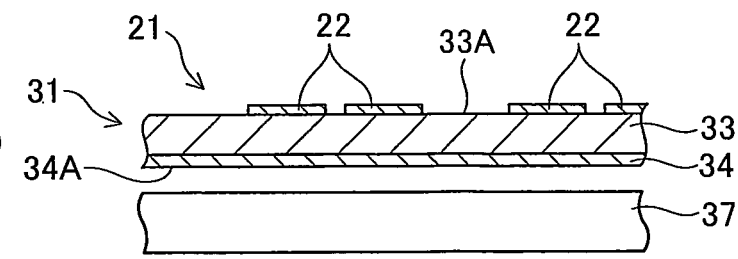

Finally, the resist pattern 39 is removed, and the metal layer 22' on the resist pattern 39 is lifted off to form metal patterns 22 (FIG. 14C). Thereafter, the structure 32 is released from the support substrate 37 (FIG. 14D), whereby the inventive optical element 21 is obtainable.

In the aforesaid manufacturing method, the lift-off process by removal of the resist pattern 39 is used for the formation of the metal patterns 22; however, the invention is not limited thereto at all. For instance, the vacuum film-formation process such as sputtering or vacuum evaporation using a material containing Au, Ag, Al or the like as a main component may be used to form the metal layer on the surface (pattern-formation surface 33A) of the high-content PDMS layer 33 in the structure 32, after which that metal layer is pattern etched to form the metal patterns 22.

When there is an optical element manufactured that has the metal patterns 22 on the underlay metal layer 23 formed all over the pattern-formation surface 33A as is the case with the aforesaid optical element 21', the structure 32 is first formed on the support substrate 37 (FIG. 13E). Then, the underlay metal layer 23 is formed all over the pattern-formation surface 33A by means of the vacuum film-formation process such as sputtering or vacuum evaporation using a material containing as a main component, for instance, any of Cr, Ti, Ni, W and an oxide or nitride thereof. Finally, the metal patterns 22 are formed as described above.

When there is an optical element manufactured that has the underlay metal layer 23 in the same patterns as the metal patterns 22 as is the case with the aforesaid optical element 21", the structure 32 is first formed on the support substrate 37 (FIG. 13E). Then, the underlay metal layer 23 is formed all over the pattern-formation surface 33A by means of the vacuum film-formation process such as sputtering or vacuum evaporation using a material containing as a component, for instance, any of Cr, Ti, Ni, W and an oxide or nitride thereof. Then, the metal layer is formed on the underlay metal layer 23 by means of the vacuum film-formation process such as sputtering or vacuum evaporation using a material containing Au, Ag, Al or the like as a main component. Finally, pattern etching is applied to the metal layer and the underlay metal layer 23 to form the metal patterns 22 (the underlay metal layer 23 in the same patterns as them).

In the manufacturing method of the inventive optical element, the structure 32 that is the PDMS sheet 31 is formed, and the metal patterns 22 are formed on the high-content PDMS layer 33 (pattern-formation surface 33A) making up a part of the structure 32 so that the adhesion of the metal patterns 22 to the PDMS sheet 31 is much more enhanced. The low-content PDMS layer 34 making up a part of the structure 32 is so positioned on the support substrate 37 side that the optical element 21 is easily releasable from the support substrate 37.

The aforesaid embodiments are given by way of exemplification; so the invention is not limited thereto whatsoever. For instance, when the PDMS sheet 31 is comprised of a structure in which a resinous material different from the high-content and low-content PDMS layers 33 and 34 is provided between both the layers, other resinous material may be fed onto the coating film 34' for the low-content PDMS layer to form a coating film, onto which the raw material 33" for the formation of the high-content PDMS layer 33 is fed.

By way of example but not by way of limitation, the present invention will now be explained in further details with reference to some specific examples.

EXAMPLE 1

There was a silicon substrate of 0.625 mm in thickness and 150 mm in diameter provided as the support substrate. This support substrate was found to have a surface average roughness Ra of 0.001 μm as measured on AFM (L-Trace II made by Seiko Instruments Inc.).

After a polymerization initiator was mixed with a raw material A for the formation of the low-content PDMS layer, the mixture was spin coated on the aforesaid support substrate to form a coating film A. Given the low-molecular-weight siloxane of a cyclic structure represented by $[-Si(CH_3)_2O-]_k$ where k is an integer of 3 to 20 inclusive, that raw material A was a PDMS having a low-molecular-weight siloxane content of 1,000 ppm. The thickness of the coating film A was set such that the low-content PDMS layer formed by curing had a thickness of 0.1 mm.

Then, after a polymerization initiator was mixed with a raw material B for the formation of the high-content PDMS layer, the mixture (20 grams) was added dropwise to the coating film A for the low-content PDMS layer by means of a dispenser. This raw material B was a PDMS having a low-molecular-weight siloxane content of 2,000 ppm.

Then, the mold substrate (with a molding surface having a surface average roughness Ra of 0.001 μm) was pressed against the fed raw material B to form a coating film B for the high-content PDMS layer between the mold substrate and the coating film A for the low-content PDMS layer, in which state the coating film B was let alone at normal temperature for semi-curing, followed by releasing the coating film B from the mold substrate. Finally, the coating films A and B in the semi-cured state was full-cured by heating into a structure (of 1.2 mm in thickness) made up of the high-content and low-content PDMS layers, and this structure was released from the support substrate to form a PDMS sheet.

EXAMPLE 2

Example 1 was repeated with the exception that a PDMS having a low-molecular-weight siloxane content of 7,000 ppm was used as the raw material B for the formation of the high-content PDMS layer, thereby preparing a PDMS sheet.

EXAMPLE 3

Example 1 was repeated with the exception that a PDMS having a low-molecular-weight siloxane content of 200 ppm was used as the raw material A for the formation of the low-content PDMS layer, thereby preparing a PDMS sheet.

COMPARATIVE EXAMPLE 1

Example 1 was repeated with the exception that a PDMS having a low-molecular-weight siloxane content of 200 ppm was used as the raw material A for the formation of the low-content PDMS layer and a PDMS having a low-molecular-weight siloxane of 1,000 ppm was used as the raw material B for the formation of the high-content PDMS layer, thereby preparing a PDMS sheet.

COMPARATIVE EXAMPLE 2

Example 1 was repeated with the exception that a PDMS having a low-molecular-weight siloxane content of 1,500 ppm was used as the raw material A for the formation of the low-content PDMS layer, thereby preparing a PDMS sheet.

COMPARATIVE EXAMPLE 3

Example 1 was repeated with the exception that a PDMS having a low-molecular-weight siloxane content of 1,300 ppm was used as the raw material A for the formation of the low-content PDMS layer and a PDMS having a low-molecular-weight siloxane content of 1,700 ppm was used as the raw material B for the formation of the high-content PDMS layer, thereby preparing a PDMS sheet.

[Estimation]

(Releasability)

How the structure was released from the support substrate in the aforesaid PDMS sheet preparation was observed to make estimation of releasability on the following criteria. The results are set out in Table 1 given later.

(Estimation Criteria)

○: None of the structure remained sticking to the support substrate.

x: Some of the structure remained sticking to the support substrate.

(Adhesion to Metals, Especially Cr)

A Cr thin film (of 50 nm in thickness) was formed by sputtering on the side (work surface) of the high-content PDMS layer of the PDMS sheet prepared as described above, and the adhesion of that Cr thin film to the PDMS sheet was estimated by the cross-cutting method was estimated. The results are set out in Table 1 given later. More specifically, the Cr thin film was divided by a cutter knife into 100 square areas having one side of 1 cm. After an adhesive-backed tape (Cellotape made by Nichiban Co., Ltd.) was applied to all of 100 square areas, it was pulled right above to observe whether or not there was a peeling of the Cr thin film and make estimation on the following estimation criteria.

(Estimation Criteria)

○: No peeling of the square areas off the Cr thin film or good adhesion.

x: Peeling from the square areas off the Cr thin film or poor adhesion.

(Adhesion to Metals, Especially Au)

An Au thin film (of 50 nm in thickness) was formed by sputtering on the side (work surface) of the high-content PDMS layer of the PDMS sheet prepared as described above. The adhesion of that Au thin film to the PDMS sheet was measured as described above, and estimated on the same criteria as described above. The results are set out in Table 1 given later.

(Stability)

The PDMS sheet prepared as described above was placed and maintained on a silicon substrate for 120 days while its low-content PDMS layer side (base surface) remained abutting onto it, after which whether or not the PDMS sheet remained sticking to the silicon substrate was observed. The results are set out in Table 1 given just below.

TABLE 1

| PDMS sheet | Low-molecular-weight siloxane content (ppm) | | Releasability | Adhesion to metals | | Stability |
| --- | --- | --- | --- | --- | --- | --- |
| | Raw material A | Raw material B | | To Cr | To Au | |
| Example 1 | 1,000 | 2,000 | ○ | ○ | ○ | No sticking |
| Example 2 | 1,000 | 7,000 | ○ | ○ | ○ | No sticking |
| Example 3 | 200 | 2,000 | ○ | ○ | ○ | No sticking |
| Comparative Example 1 | 200 | 1,000 | ○ | X | X | No sticking |
| Comparative Example 2 | 1,500 | 2,000 | X | ○ | ○ | Some sticking |
| Comparative Example 3 | 1,300 | 1,700 | X | X | X | Some sticking |

What is claimed is:

1. An optical element comprising:
a polydimethylsiloxane sheet having a pattern-formation surface defined by one surface and a base surface defined by another surface, and
a plurality of metal patterns positioned on said pattern-formation surface, wherein:
given a low-molecular-weight siloxane of a cyclic structure represented by [—Si(CH$_3$)$_2$O—]$_k$ where k is an integer of 3 to 20 inclusive, said polydimethylsiloxane sheet has a structure in which said pattern-formation surface and said base surface each contains said low-molecular-weight siloxane, and a parts by weight of said low-molecular-weight siloxane at said pattern-formation surface is more than a parts by weight of said low-molecular-weight siloxane at said base surface, and
a spacing between adjacent said metal patterns is variable by deformation of said polydimethylsiloxane sheet.

2. An optical element comprising:
a polydimethylsiloxane sheet having a pattern-formation surface defined by one surface and a base surface defined by another surface, and
a plurality of metal patterns positioned on said pattern-formation surface, wherein:
given a low-molecular-weight siloxane of a cyclic structure represented by [—Si(CH$_3$)$_2$O—]$_k$ where k is an integer of 3 to 20 inclusive, said polydimethylsiloxane sheet has a structure in which said pattern-formation surface and said base surface each contains said low-molecular-weight siloxane and a parts by weight of said low-molecular-weight siloxane at said pattern-formation surface is more than a parts by weight of said low-molecular-weight siloxane at said base surface, and
said metal patterns each comprises a substantially ring-form pattern having a notch in at least a part thereof, wherein a space of said notch is variable by deformation of said polydimethylsiloxane sheet.

3. The optical element as recited in claim 1, wherein:
said polydimethylsiloxane sheet comprises on at least said pattern-formation surface a polydimethylsiloxane layer containing said low-molecular-weight siloxane in an amount of 2,000 ppm or more, and
on at least said base surface a polydimethylsiloxane layer containing said low-molecular-weight siloxane in an amount of 1,000 ppm or less.

4. The optical element as recited in claim 1, wherein said metal patterns contain any of Au, Ag, and Al as a main component.

5. The optical element as recited in claim 1, wherein there is an underlay metal layer between said polydimethylsiloxane sheet and said metal patterns, wherein said underlay metal layer has the same pattern as said metal patterns.

6. The optical element as recited in claim 5, wherein said underlay metal layer contains as a main component any of Cr, Ti, Ni, W and an oxide or nitride thereof.

7. The optical element as recited in claim 1, wherein there is an underlay metal layer between said polydimethylsiloxane sheet and said metal patterns, wherein said underlay metal layer lies all over the pattern-formation surface of said poly-dimethylsiloxane sheet.

8. The optical element as recited in claim 7, wherein said underlay metal layer contains as a main component any one of Cr, Ti, Ni, W and an oxide or nitride thereof.

9. The optical element as recited in claim 1, wherein said pattern-formation surface of said polydimethylsiloxane sheet has a surface average roughness Ra of 0.1 µm or less.

10. A polydimethylsiloxane sheet, comprising a structure that, given a low-molecular-weight siloxane of a cyclic structure represented by [—Si(CH$_3$)$_2$O—]$_k$ where k is an integer of 3 to 20 inclusive, has on at least one surface a first polydimethylsiloxane layer containing said low-molecular-weight siloxane, and on at least another surface a second polydimethylsiloxane layer containing said low-molecular-weight siloxane, said first polydimethylsiloxane layer containing said low-molecular-weight siloxane in an amount of parts by weight that is greater than a parts by weight of said low-molecular-weight polydimethylsiloxane contained in the second layer, wherein said first polydimethylsiloxane layer defines a work surface, and said second polydimethylsiloxane layer defines a base surface.

11. The polydimethylsiloxane sheet as recited in claim 10, wherein said first polydimethylsiloxane layer contains said low-molecular-weight siloxane in an amount of 2,000 ppm or more, and said second polydimethylsiloxane layer contains said low-molecular-weight siloxane in an amount of 1,000 ppm or less.

12. The polydimethylsiloxane sheet as recited in claim 10, wherein said structure has a thickness ranging from 0.01 mm to 10 mm, and said second polydimethylsiloxane layer has a thickness ranging from 0.005 mm to 5 mm.

13. The polydimethylsiloxane sheet as recited in claim 10, wherein said work surface has a surface average roughness Ra of 0.1 μm or less.

\* \* \* \* \*